United States Patent
Huang et al.

(10) Patent No.: US 12,376,326 B2
(45) Date of Patent: *Jul. 29, 2025

(54) GATE RESISTANCE IMPROVEMENT AND METHOD THEREOF

(71) Applicant: Taiwan Semiconductor Manufacturing Co., Ltd., Hsinchu (TW)

(72) Inventors: Ju-Li Huang, Nantou County (TW); Hsin-Che Chiang, Taipei (TW); Yu-Chi Pan, Zhubei (TW); Chun-Ming Yang, Taipei (TW); Chun-Sheng Liang, Changhua County (TW); Ying-Liang Chuang, Zhubei (TW); Ming-Hsi Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,514

(22) Filed: Jul. 28, 2023

(65) Prior Publication Data

US 2023/0378360 A1    Nov. 23, 2023

Related U.S. Application Data

(60) Continuation of application No. 17/339,020, filed on Jun. 4, 2021, which is a division of application No.
(Continued)

(51) Int. Cl.
*H01L 29/78* (2006.01)
*H01L 21/285* (2006.01)
(Continued)

(52) U.S. Cl.
CPC ....... *H10D 30/62* (2025.01); *H01L 21/28556* (2013.01); *H01L 21/32134* (2013.01);
(Continued)

(58) Field of Classification Search
CPC ............. H01L 29/785; H01L 29/42372; H01L 29/4966; H01L 21/82345; H01L 21/28088; H01L 21/823456; H01L 29/66795
See application file for complete search history.

(56) References Cited

U.S. PATENT DOCUMENTS 9,437,714 B1    9/2016  Adusumilli et al.
9,761,684 B2    9/2017  Huang et al.
(Continued)

FOREIGN PATENT DOCUMENTS

| CN | 101438389 A | 5/2009 |
| CN | 103794505 A | 5/2014 |
| CN | 105374670 A | 3/2016 |

*Primary Examiner* — Julia Slutsker
(74) *Attorney, Agent, or Firm* — Sterne, Kessler, Goldstein & Fox P.L.L.C.

(57) ABSTRACT

The present disclosure describes structure and method of a fin field-effect transistor (finFET) device. The finFET device includes: a substrate, a fin over the substrate, and a gate structure over the fin. The gate structure includes a work-function metal (WFM) layer over an inner sidewall of the gate structure. A topmost surface of the WFM layer is lower than a top surface of the gate structure. The gate structure also includes a filler gate metal layer over the topmost surface of the WFM layer. A top surface of the filler gate metal layer is substantially co-planar with the top surface of the gate structure. The gate structure further includes a self-assembled monolayer (SAM) between the filler gate metal layer and the WFM layer.

20 Claims, 7 Drawing Sheets

Related U.S. Application Data

16/287,368, filed on Feb. 27, 2019, now Pat. No. 11,031,500.

(60) Provisional application No. 62/712,394, filed on Jul. 31, 2018.

(51) Int. Cl.
*H01L 21/3213* (2006.01)
*H01L 29/40* (2006.01)
*H01L 29/423* (2006.01)
*H01L 29/49* (2006.01)
*H10D 30/62* (2025.01)
*H10D 64/01* (2025.01)
*H10D 64/27* (2025.01)
*H10D 64/66* (2025.01)

(52) U.S. Cl.
CPC ........... *H10D 64/01* (2025.01); *H10D 64/517* (2025.01); *H10D 64/667* (2025.01)

(56) References Cited

U.S. PATENT DOCUMENTS

| | | |
|---|---|---|
| 2007/0262451 A1 | 11/2007 | Rachmady et al. |
| 2014/0353734 A1 | 12/2014 | Xie et al. |
| 2016/0049495 A1 | 2/2016 | Trevino et al. |
| 2016/0372565 A1 | 12/2016 | Huang et al. |
| 2018/0012810 A1 | 1/2018 | Zhou |
| 2019/0189785 A1* | 6/2019 | Jambunathan .... H01L 29/66795 |

\* cited by examiner

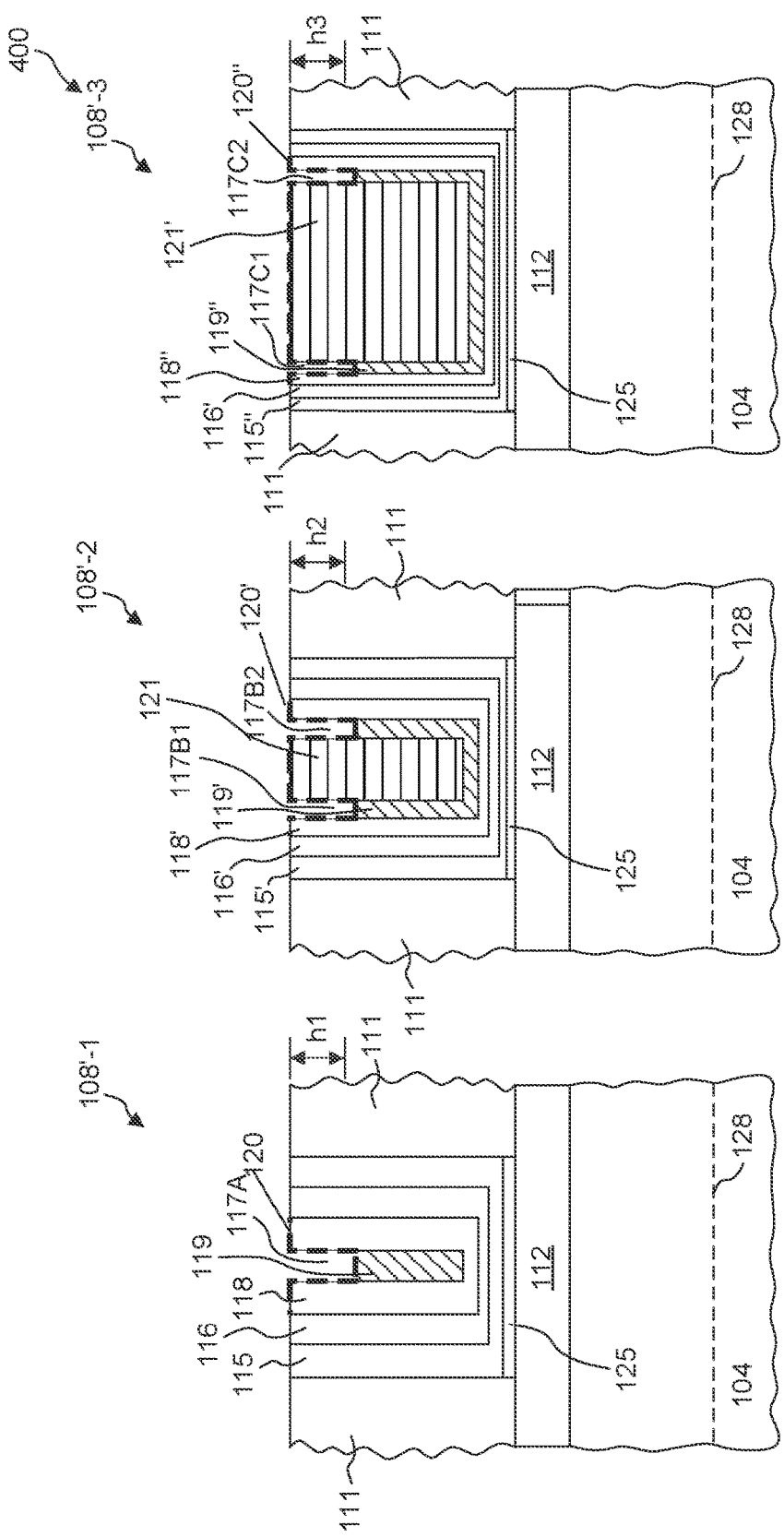

GATE RESISTANCE IMPROVEMENT AND METHOD THEREOF

CROSS-REFERENCE TO RELATED APPLICATIONS

This application is a continuation of U.S. Non-Provisional patent application Ser. No. 17/339,020, titled "Gate Resistance Improvement and Method Thereof," filed on Jun. 4, 2021, which is a divisional of U.S. Non-Provisional patent application Ser. No. 16/287,368, titled "Gate Resistance Improvement and Method Thereof," filed on Feb. 27, 2019, which claims the benefit of U.S. Provisional Patent Application No. 62/712,394, titled "Gate Resistance Improvement and Method Thereof," filed on Jul. 31, 2018. The entire contents of the aforementioned applications are incorporated by reference herein in their entireties.

BACKGROUND

As a key component in semiconductor industry, complementary metal-oxide-semiconductor field-effect transistors (CMOSFETs) play an important role in various electronic devices. In semiconductor manufacturing, metal and high-k dielectric materials (materials with high dielectric constants k) have been used to replace polysilicon and silicon dioxide for forming gate structures in transistors and meet the performance requirements (e.g., mobility of carriers and device speed) as the dimensions of transistors scale down. To form metal gates, dummy gates are first formed and removed to form space (e.g., a trench or place-holder) for the metal gate. High-k dielectric materials and metal are subsequently deposited into the trench to fill in the trench and form a metal gate.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features can be arbitrarily increased or reduced for clarity of illustration and discussion.

FIGS. 3A-3C, 4A-4C, and 5A-5C are illustrations of cross-sectional views of gate electrodes, according to some embodiments.

DETAILED DESCRIPTION

Figure 1A:
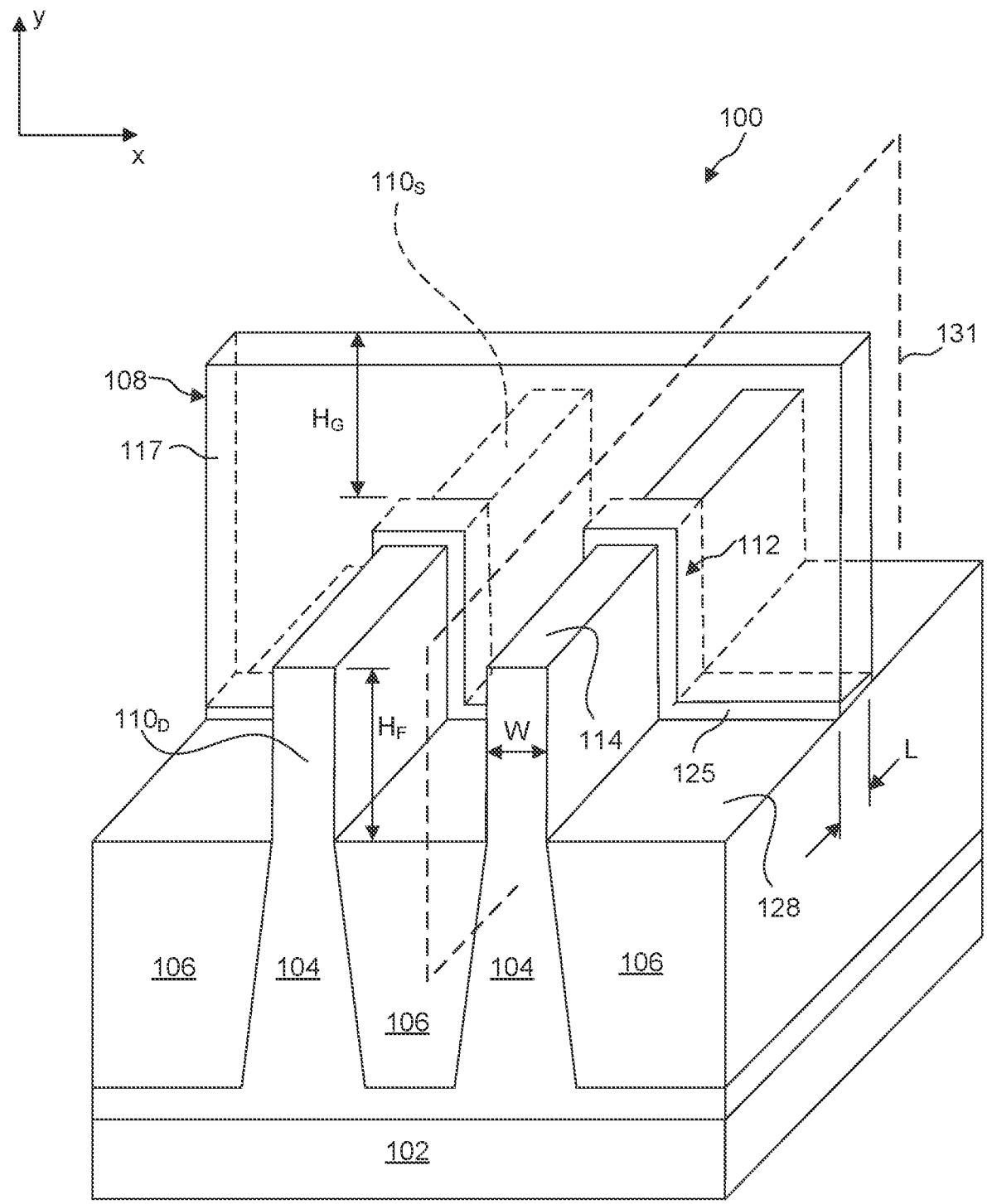
FIG. 1A is an illustration of an MOS field-effect transistor (MOSFET) device, according to some embodiments.

The following disclosure provides many different embodiments, or examples, for implementing different features of the provided subject matter. Specific examples of components and arrangements are described below to simplify the present disclosure. These are merely examples and are not intended to be limiting.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "finFET" refers to a FET that is formed over a fin that is vertically oriented with respect to the planar surface of a wafer.

"S/D" refers to the source/drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material can be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

An issue with the formation of metal gates with small gate lengths (Lg) is the deposition of a sufficient amount of metal into the gate-forming trench. For example, a metal gate with a gate length of 7 nm ("7-nm metal gate") can have a higher gate resistance than a metal gate with a gate length of 20 nm ("20-nm metal gate") due to the smaller amount of metal deposited in the 7-nm metal gate. Similarly, the 7-nm and 20-nm metal gates can each have a higher gate resistance than a metal gate with a gate length of 240 nm ("240-nm gate length").

To reduce gate resistance, dry etch back and wet etch back methods have been used to remove portions of the work-function metal (WFM) in metal gates and fill in more metal in the metal gates. However, these etch back methods can have poor etching selectivity and cause loss of metal in the etched metal gates. For example, besides the WFM, the gate metal (e.g., tungsten) and the barrier layer (e.g., titanium nitride (TiN)) can also be etched back, resulting in a recessed depth in the etch-back profile. Gate height can be also reduced. In addition, by-products formed during these etch back methods can be difficult to remove. These etch back methods also do not offer a desirable etching selectivity of WFM over gate metal. For example, gate metals can be etched back using the wet etch methods. As a result, as the semiconductor devices continue to scale down, it becomes more difficult to fabricate metal gates with desirably low gate resistance.

Embodiments of the present disclosure describe a selective etch back process to remove a portion of WFM that surrounds the metal in a metal gate. The space formed by the removal of the WFM is then filled with a conductive material with comparable or lower resistance to increase the metal volume in the metal gate. The selective etch back process forms one or more self-assembled monolayers (SAM) over the etched portion. The SAM can improve the adhesion between the etched portion and the newly-deposited filler gate metal. The newly-deposited filler gate metal (e.g., the conductive material) can be deposited using a selective deposition method and can include desired/different dopant concentration/types to further improve (e.g., reduce) the gate resistance. No additional mask or additional fabrication processes are needed for the selective etch back and the selective deposition method. Gate height is thus not substantially affected (e.g., reduced) and more metal can be deposited into the metal gate. By using the disclosed method, the metal gate can have an increased amount of metal than originally fabricated, reducing the gate resistance and improving the electrical properties of the semiconductor device. Further, the newly-deposited filler gate metal can adhere to the etched portion of the metal gate with little or no void formed therein. The formed gate metal can be more uniform, thus reducing gate resistance. Embodiments of the disclosed method and structure thus improve device performance.

FIGS. 1A, 1B, 2, 3A-3C, 4A-4C, and 5A-5C illustrate a metal gate fabrication process in various semiconductor devices using the gate resistance improving method provided by embodiments of the present disclosure. The fabrication process can form metal gates with an increased amount of gate metal which provides lower gate resistance than other gate metal structures. The gate metal added based on the embodiments disclosed herein can adhere to the parts contacting the filler gate metal with little or no voids therein. Term "filler gate metal" refers to the conductive material subsequently deposited into the removed portion(s) of WFM layer and functions as the gate metal of the metal gate structure. Embodiments of the present disclosure can be used to form metal gates of various metals, e.g., tungsten, copper, aluminum, any other suitable metal, or a combination thereof. The metal gates can be formed in various semiconductor devices and structures. For example, embodiments of the present disclosure can be used to form metal gates in planar devices and finFETs. The fabrication process provided herein is exemplary, and alternative processes in accordance with this disclosure can be performed that are not shown in the following figures.

FIG. 1A is an isometric view of semiconductor structure 100, in accordance with some embodiments of the present disclosure. Semiconductor structure 100 includes finFETs. Semiconductor structure 100 includes a substrate 102, a plurality of fins 104, a plurality of isolation structures 106, and a gate structure 108 that is disposed over the sidewalls and top surface of each of fins 104. Fins 104 and isolation structures 106 have top surfaces 114 and 128, respectively. Gate structure 108 includes a gate dielectric layer 125, and a gate electrode structure 117. In some embodiments, one or more additional layers or structures can be included in gate structure 108. The isometric view of FIG. 1A is taken after the patterning process (e.g., etching) of a gate dielectric layer and a gate electrode layer to form gate structure 108. FIG. 1A shows only one gate structure 108. ICs (e.g., integrated circuits) can include a plurality of gate structure(s).

Each of the plurality of fins 104 shown in FIG. 1A includes a pair of S/D terminals. For ease of description, a first one of the pair of S/D terminals is referred to as a source region $110_S$" and a second one of the pair of S/D terminals is referred to as a "drain region $110_D$," where S/D terminals are formed in, on, and/or surrounding fin 104. A channel region 112 of fin 104 underlies gate structure 108. Gate structure 108 has a gate length Lg, and a gate width ($2H_F$+W), as shown in FIG. 1A. In some embodiments, fin width W is in a range from about 6 nm to about 12 nm. In some other embodiments, fin width W is in a range from about 4 nm to about 6 nm. Gate height HG of gate structure 108, measured from fin top surface 114 to the top of gate structure 108, is in a range from about 50 nm to about 80 nm, in some embodiments. Fin height $H_F$ of fin 104, measured from the isolation structure top surface 128 to fin top surface 114, is in a range from about 25 nm to about 35 nm, in some embodiments.

Substrate 102 can be a silicon substrate. Alternatively, substrate 102 can include other elementary semiconductors, such as germanium (Ge); a compound semiconductor including silicon carbide (SiC), gallium arsenide (GaAs), gallium phosphide (GaP), indium phosphide (InP), indium arsenide (InAs), and/or indium antimonide (InSb); an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or combinations thereof. In some embodiments, substrate 102 is a semiconductor on insulator (SOI). In some embodiments, substrate 102 can be an epitaxial material.

Isolation structures 106 include a dielectric material and can be formed of silicon oxide ($SiO_x$), spin-on-glass (SOG), silicon nitride (SiN), silicon oxynitride (SiON), fluorine-doped silicate glass (FSG), a low-k dielectric material, and/or other suitable insulating material. Isolation structures 106 can be shallow trench isolation (STI) structures. In some embodiments, isolation structures 106 are STI structures and are formed by etching trenches in substrate 102. The trenches can then be filled with the insulating material, followed by a chemical mechanical polish/planarization (CMP) and etch-back. Other fabrication techniques for isolation structures 106 and/or fin 104 are possible. Isolation structures 106 can include a multi-layer structure, for example, having one or more liner layers.

Fins 104 are active regions where one or more transistors are formed. Fin 104 can include silicon or another elementary semiconductor, such as Ge; a compound semiconductor including SiC, GaAs, GaP, InP, InAs, and/or InSb; an alloy semiconductor including SiGe, GaAsP, AlInAs, AlGaAs, GaInAs, GaInP, and/or GaInAsP; or combinations thereof. Fins 104 can be fabricated using any suitable process, including photolithography and etch processes. The photolithography process can include forming a photoresist layer (resist) overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into isolation structures 106, leaving protruding fins. The recesses can be etched using reactive ion etch (RIE) and/or other suitable processes. Numerous other methods to form fins 104 on substrate 102 can be used. Fins 104 can include epitaxial material, in accordance with some embodiments.

Gate structure 108 shown in FIG. 1A can be a sacrificial gate structure in a replacement gate process and can be replaced to form a metal gate structure. Before the replacement process, gate electrode structure 117 can include a sacrificial material such as polysilicon. The sacrificial material can be removed in the replacement process, and the trench/space/opening formed by the removal of the sacrificial material can be filled with conductive materials (e.g., metal) to form the metal gate structure. Spacer layer 111 can remain in the replacement process and hold the space for the deposition of the conductive materials. Subsequently, conductive material to form the metal gate structure can be deposited into the space held by spacer layer 111. Details of forming a metal gate structure are described below.

Semiconductor device structure 100 includes fins 104 and gate structure 108. The semiconductor device structure 100 can include additional processing to form various features, such as lightly-doped-drain (LDD) regions and doped S/D structures, of the transistor utilizing structure 100. LDD regions are formed in fins 104 by doping, and the term LDD regions is used to describe lightly-doped regions disposed between the channel region of a transistor and at least one of the transistor's S/D regions. Ion implantation can be used as the doping process. Embodiments in accordance with the present disclosure are not limited to ion implantation as the doping process for LDD regions.

Figure 1B:
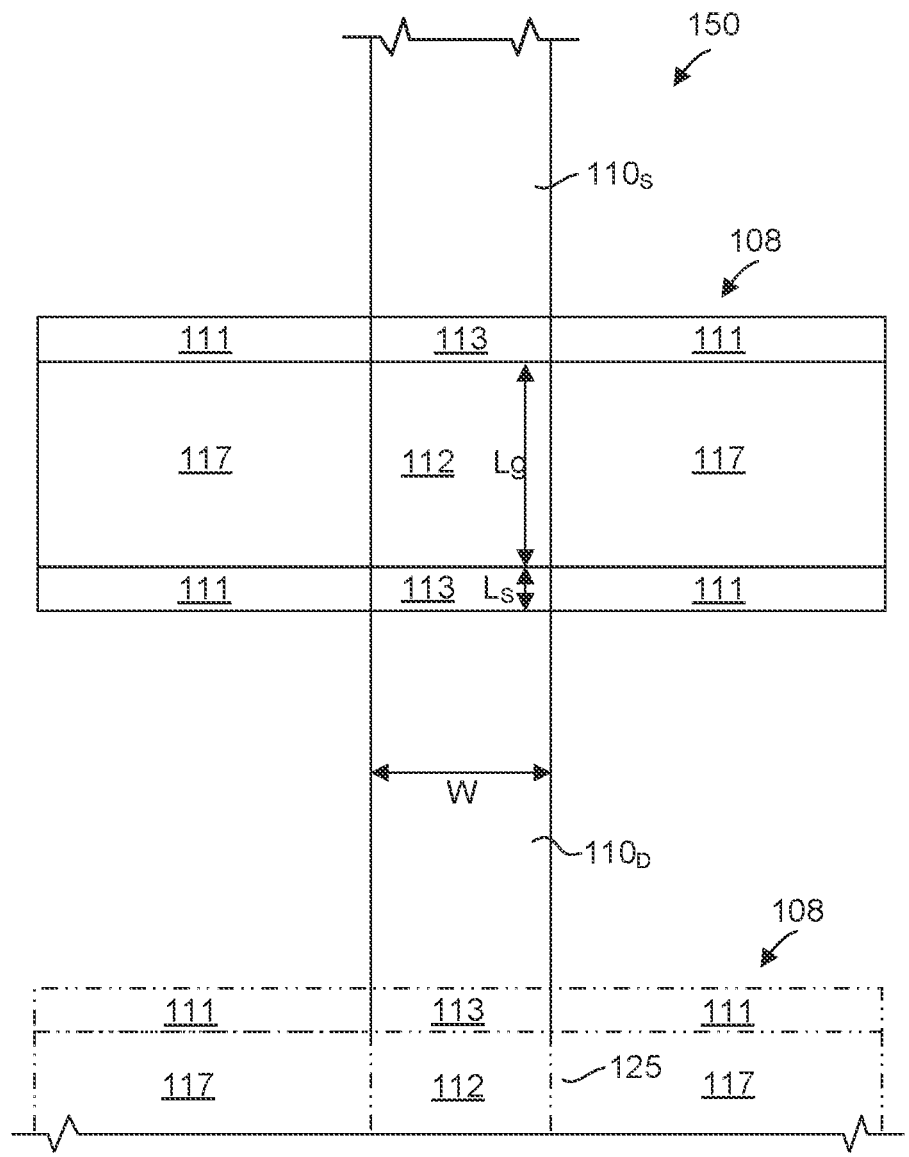
FIG. 1B is an illustration of a top view of the NMOSFET device in FIG. 1A, according to some embodiments.

FIG. 1B shows a top view of a transistor region 150 formed with one of the fins 104 of FIG. 1A and taken on a surface level with the top surface 128 of isolation structure 106. Transistor region 150 includes S/D regions $110_S$ and $110_D$. Transistor region 150 also includes a channel region 112, which is part of fin 104 and is surrounded by gate structure 108 on three sides, as shown in FIG. 1A. The channel region 112 underlies the gate structure 108 and has a width (fin width) W. Depending on fabrication processing conditions and device designs, the length of channel region 112 can be slightly different from gate length Lg. Solely for the ease of description, the length of channel region 112 is denoted as gate length Lg. Transistor region 150 also includes gate dielectric layer 125 and gate electrode structure 117. FIG. 1B also shows spacer layer 111 formed on gate structures 108. LDD regions 113 are formed in the top surface and side walls of fin 104. LDD region 113 that is shown in FIG. 1B has a width W and a length Ls. Boundaries of LDD regions 113 can be aligned or misaligned with spacer layers 111 along the surface level shown in FIG. 1B. FIG. 1B also shows another gate structure 108 by dotted lines. This other gate structure 108 has been described above as being similar and parallel to the gate structure 108 described above and is not shown in FIG. 1A.

FIG. 1B illustrates spacer layer 111 surrounding sacrificial gate electrode structure 117 of gate structure 108. Spacer layer 111 can be formed by any suitable method. For example, a conformal spacer layer is first deposited over the substrate, including gate structures 108. An etch-back process can then be used to remove portions of the conformal spacer layer to expose a portion of the S/D region for ion implantation. The portions of the conformal spacer layer over gate structures 108 is subsequently removed. The remaining conformal spacer layer forms spacer layers 111 at least on the sidewalls of gate electrode structure 117. Spacer layer 111 can include a dielectric material, such as silicon oxide, SiON, silicon carbide nitride (SiCN), SiN, any other suitable material, or any combinations thereof. In some embodiments, the deposition process is a plasma-enhanced chemical vapor deposition (PECVD) process. Other applicable deposition processes can also be used. In some embodiments, the thickness of spacer layer 111 is in a range from about 2 nm to about 14 nm. Spacer layer 111 provides an offset distance, which is the thickness of spacer layer 111, from LDD region 113 and prevents dopants from being implanted in the channel region 112.

LDD region 113 is then formed in fin 104 between adjacent spacer layers 111 using any suitable process. For example, an ion implant process can be used to form LDD region 113 and can utilize any suitable doping species. Although LDD region 113 is shown as proximate to the top surface of fin 104, LDD region 113 can be proximate to both the top surface and sidewalls of fin 104. The LDD implantation can be performed vertically, or tilted toward the sidewalls of fin 104. Depending on the implantation process, LDD region 113 can extend to a certain depth below the surfaces of fin 104. For example, LDD region 113 can extend to a depth below the top surface of fin 104. Alternatively, LDD region 113 can extend from the sidewall surfaces of fin 104 into the interior of fin 104. Substrate 102 can have both p-type and n-type devices. Additional processes, such as lithography patterning processes, can be used to protect the p-type device regions from dopant ions for n-type devices. After the dopant ions are implanted, a thermal anneal can be performed to drive in and to activate the dopants. The thermal anneal can be a rapid thermal processing (RTP) anneal, a spike anneal, a millisecond anneal, a laser anneal, any other suitable anneal process, or any combination thereof. Spike anneal operates at a peak anneal temperature for a time period on the order of seconds. Millisecond anneal operates at the peak anneal temperature for a time period on the order of milliseconds. Laser anneal operates at the peak anneal temperature for a time period on the order of nanoseconds to microseconds.

Further, S/D region 110 is formed in LDD region 113 in fin 104 between adjacent spacer layers 111 using any suitable process. For example, an ion implantation, using any suitable doping species, can be performed to form S/D region 110. In another example, a portion of LDD region 113 between adjacent spacer layers 111 is removed and an epitaxial process is performed to grow suitable S/D material between adjacent spacer layers 111. In-situ doping, using any suitable dopants, can be used to dope S/D region 110 to any suitable doping level. Based on different applications/embodiments, the depth of S/D region 110 from top surface 114 can be greater or smaller than depth of LDD region 113. Depending on the applications, the lateral width of S/D region 110 can be smaller than, equal to, or greater than the lateral width of LDD region 113.

Referring to FIGS. 2-5, different perspective and cross-sectional views of finFETs at various stages of fabrication according to various illustrative embodiments of the present disclosure are shown. The method provided by the present disclosure can be a part of or after a gate replacement process. In the present disclosure, the metal gate structure being formed using the disclosed method is referred to as gate structure 108' or intermediate gate structure 108''. Gate structure 108 illustrated in FIGS. 1A and 1B can also be referred to as "sacrificial gate structure 108" and gate electrode structure 117 illustrated in FIGS. 1A and 1B can also be referred to as "sacrificial gate electrode structure 117." Intermediate gate structure 108' can be formed based on sacrificial gate structure 108.

FIGS. 2-5 illustrate an exemplary fabrication process to form such metal gate structures. In some embodiments, substrate 102 includes silicon. In the present disclosure, structures of different dimensions (e.g., the intermediate gate structures 108' of different gate lengths) are arranged in the same figures for illustrative purposes. Dimensions of these structures in the figures do not intend to indicate the true dimensions of the structures. For illustrative purposes, structures illustrated in FIGS. 2-5 are cross-sectional views of semiconductor structures taken along cut line 131 of FIG. 1A or a cut line along a similar direction. The semiconductor structures can be formed in a same IC or different ICs. The semiconductor structures can be formed through the same fabrication processes or different fabrication processes.

Figure 2:
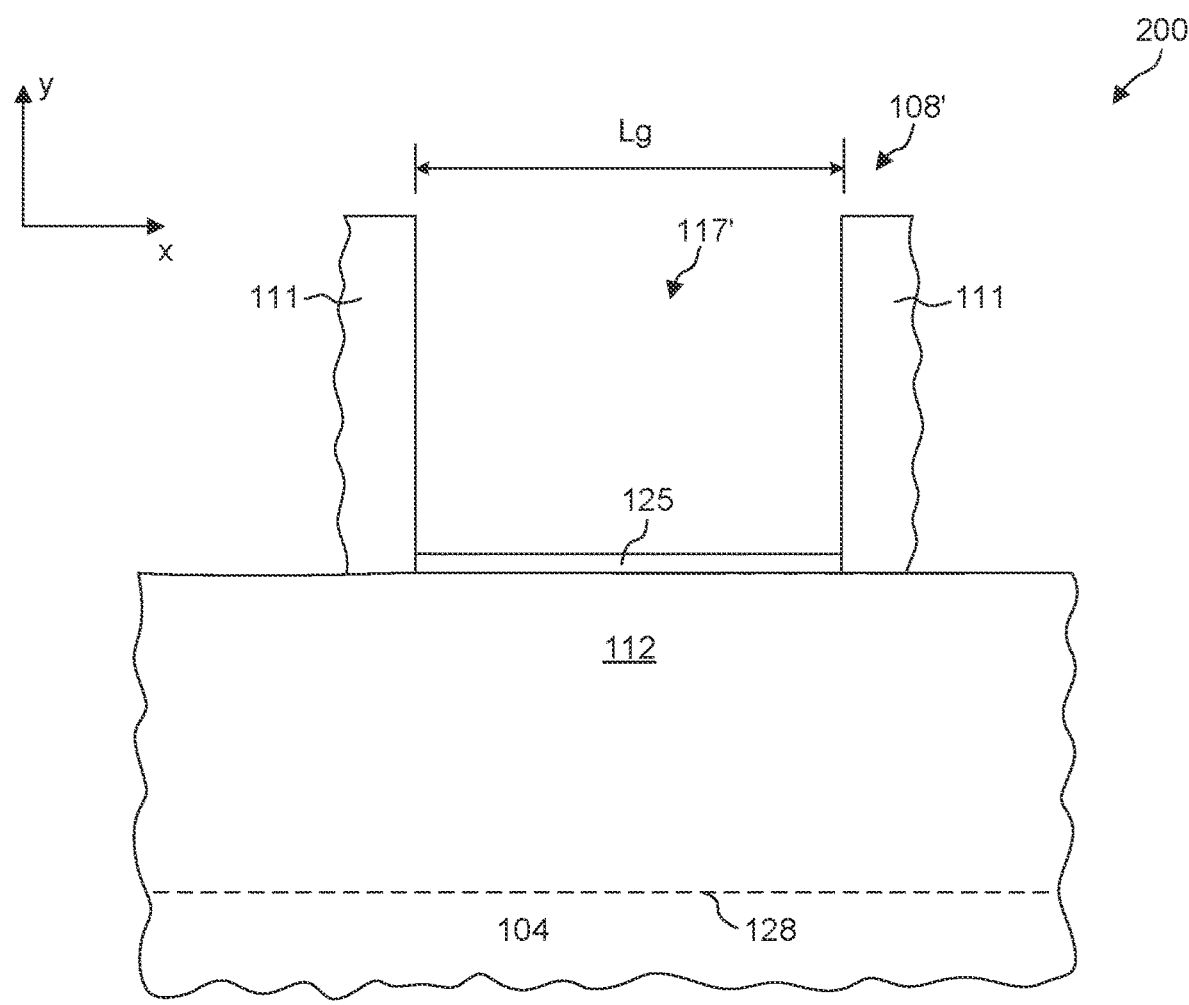
FIG. 2 is an illustration of a cross-sectional view of a gate electrode, according to some embodiments.

FIG. 2 shows structure 200 including an exemplary intermediate gate structure 108', according to some embodiments, taken along cut line 131 shown in FIG. 1A. Intermediate gate structure 108' can be formed based on sacrificial gate structure 108 and include a gate-forming trench 117' surrounded by spacer layer 111. The gate length (Lg) of the subsequently-formed metal gate structure is defined as the lateral length of the subsequently-formed metal gate electrode between the source and the drain electrodes, as shown in FIG. 2. Intermediate gate structure 108' can be formed from sacrificial gate structure 108 after sacrificial gate electrode structure 117 has been removed. Gate-forming trench 117' can be formed after the removal of sacrificial gate electrode structure 117. The removal of sacrificial gate electrode structure 117 can include the removal of sacrificial gate electrode material (e.g., polysilicon) from sacrificial gate structure 108, resulting in gate-forming trench 117' to be formed. Spacer layer 111 can remain on fin 104 and be used to hold the space for the deposition of other layers in intermediate gate structure 108' and protect the subsequently-formed metal gate structure. Intermediate gate structure 108' can be used to represent a partially-formed gate structure with any suitable gate length Lg.

The removal of sacrificial gate electrode 117 can include any suitable process. For example, a patterning process (e.g., a photolithography process) and a follow-up etching process (a wet etch or a dry etch process) can be used to remove the sacrificial material surrounded by spacer layer 111. One or more hard masks can be formed over sacrificial gate structure 108 during the patterning process and the etching process to expose the sacrificial material and protect spacer layer 111. The etching process can be a selective etch or a timed etch such that the sacrificial material can be fully removed. In some embodiments, the selective etch requires no additional etch mask, e.g., the selective etch can be performed directly on the semiconductor structures 100. Details of the removal process and related masks are not described herein. Channel region 112 can be formed under sacrificial gate structure 108 before the formation of sacrificial gate structure 108 or after the removal of sacrificial gate electrode structure 117. A dotted line 128 indicates the level of top surfaces of isolation structures 106. Gate dielectric layer 125 can be formed as part of sacrificial gate structure 108 or after the formation of gate-forming trench 117'. Any suitable processes can be used to form gate dielectric layer 125. For example, gate dielectric layer 125 can include SiN, $SiO_x$, SiCN, SiOCN, any other suitable material, or any combination thereof. In another example, gate dielectric layer 125 can also include hafnium dioxide ($HfO_2$), zirconium dioxide ($ZrO_2$), lanthanum dioxide ($LaO_2$), and/or other suitable high-k dielectric materials, and can be deposited using PECVD, chemical vapor deposition (CVD), physical vapor deposition (PVD), and/or atomic layer deposition (ALD). The gate dielectric layer can reduce reaction between the substrate material in fin 104 and the subsequently-formed high-k dielectric layer and maintain the reliability of semiconductor structure 100 to maintain the carrier mobility in channel region 112. In some embodiments, gate dielectric layer 125 is formed by PECVD after the formation of gate-forming trench 117'. In some embodiments, gate dielectric layer 125 includes $SiO_x$ and has a thickness of about 6 to 10 Å.

Figures 3A, 3B, 3C:
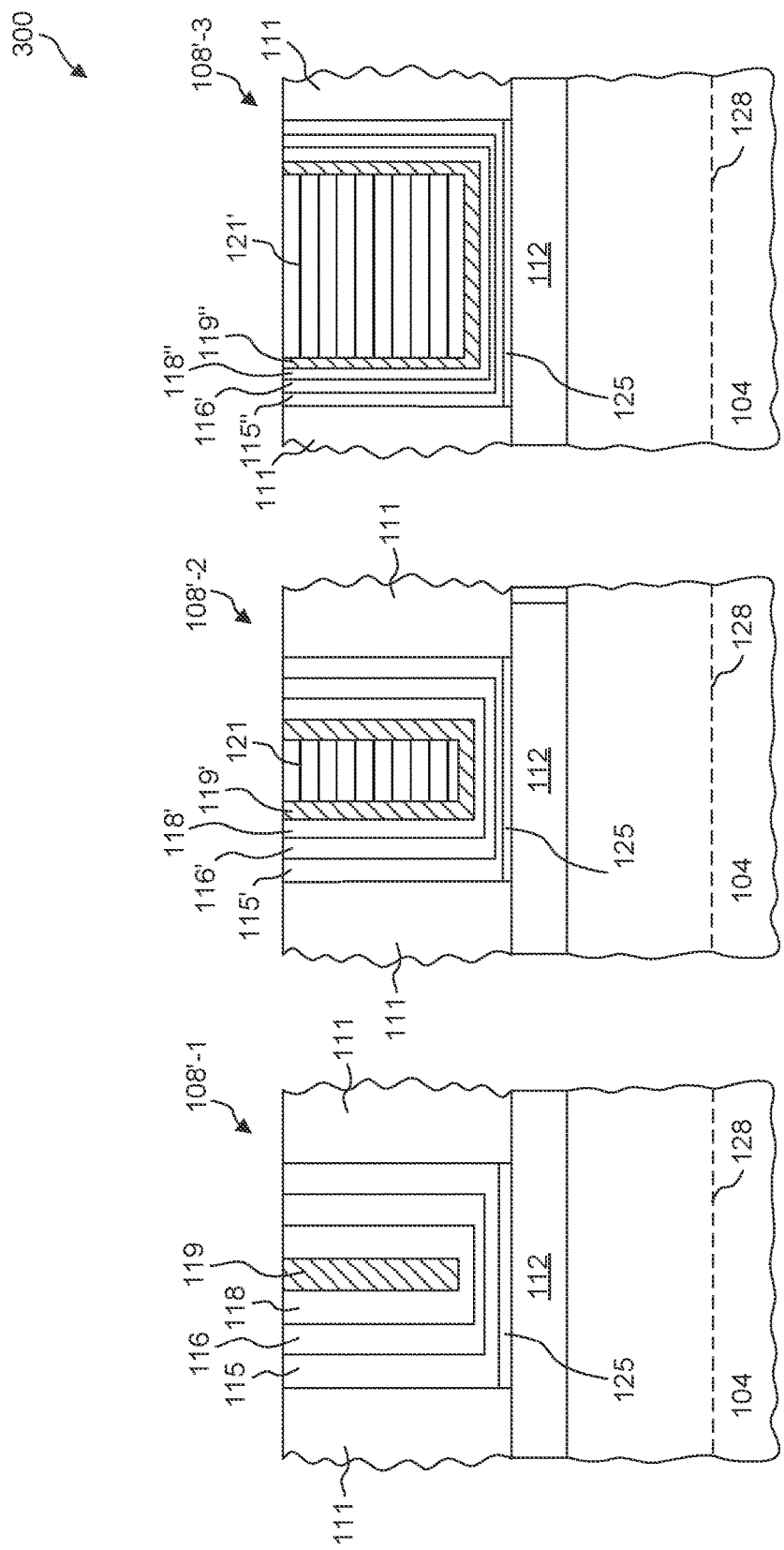

FIGS. 3A-3C illustrate structures 300 including exemplary intermediate gate structures 108'-1, 108'-2, and 108'-3 of different gate lengths, each taken along cut line 131 shown in FIG. 1A, according to some embodiments. Intermediate gate structures 108' shown in FIGS. 3A-3C can each be formed from a sacrificial gate structure 108 as illustrated in FIG. 2. For illustrative purposes, the gate lengths of intermediate gate structure 108'-1, 108'-2, and 108'-3 are each different from one another to describe the disclosed method and structure. In some embodiments, Lg(108'-1)<Lg(108'-2)<Lg(108'-3), where Lg(intermediate gate structure) represents the gate length of the intermediate gate structure. For example, Lg(108'-1) can be 7 nm, Lg(108'-2) can be 20 nm, and Lg(108'-3) can be 240 nm.

In some embodiments, intermediate gate structures 108'-1, 108'-2, and 108'-3 illustrated in FIGS. 3A-3C can each be formed from an intermediate gate structure having a similar structure (e.g., of different dimensions and/or different gate length) as intermediate gate structure 108' shown in FIG. 2. Intermediate gate structures 108'-1, 108'-2, and 108'-3 illustrated in FIGS. 3A-3C can each be formed from an inter-mediate gate structures 108' of FIG. 2 by sequentially depositing a plurality of layers into gate-forming trench 117'. The subsequently-formed metal gate structure can include barrier layer(s), gate dielectric layer(s), work function layer(s), metal layer(s) and/or other suitable materials filled in a gate-forming trench. In other embodiments, the metal gate structure can further include capping layers, etch stop layers, and/or other suitable materials. The spacer layer 111 can include dielectric materials, such as SiN, silicon oxy-carbonitride (SiOCN), SiCN, other suitable insulating materials, or any combination thereof. For illustrative purposes, gate dielectric layer 125 in different figures of the present disclosure indicates the gate dielectric layer at the bottom of a metal gate structure. Gate dielectric layer 125 can include the same or different materials in different structures.

A high-k dielectric layer can first be formed over gate dielectric layer 125 and sidewall of spacer layer 111 in gate-forming trench 117'. The high-k dielectric layer can form a barrier between channel region 112 and the subsequently-formed metal gate electrode to prevent leakage current from channel region 112 and reduce power consumption of semiconductor structure 100. In some embodiments, the high-k dielectric layer can include $HfO_2$, $ZrO_2$, $LaO_2$, other suitable materials, or any combination thereof. The high-k dielectric layer can be formed by CVD, PVD, ALD, PECVD, other suitable depositions methods, or any combination thereof. In some embodiments, the high-k dielectric layer has a thickness of about 5 nm to about 15 nm. In the present disclosure, 115, 115', and 115" represents the high-k dielectric layer in intermediate gate structures 108'-1, 108'-2, and 108'-3, respectively.

A capping layer can further be formed over the high-k dielectric layer in gate-forming trench 117'. In an example, the capping layer can include high-k barrier materials, such as TiN and/or TSN. In another example, the capping layer can protect the high-k dielectric layer from a subsequently-formed barrier metal layer and can decrease traps at the interface of gate dielectric layer 125 and substrate 102. The capping layer can be formed by CVD, PVD, ALD, PECVD, metal-organic chemical vapor deposition (MOCVD), sputtering, other suitable depositions methods, or any combination thereof. The capping layer can have a thickness of about 1 nm to about 3 nm. In some embodiments, the capping layer is about 1.5 nm. In the present disclosure, 116, 116', and 116" represents the capping layer in intermediate gate structures 108'-1, 108'-2, and 108'-3, respectively.

A barrier metal layer can be further formed over the capping layer in gate-forming trench 117'. The barrier layer can include barrier metals/compounds, such as tantalum nitride (TaN) and/or niobium nitride (NbN). The barrier metal layer can improve the adhesion between the capping layer and the subsequently-formed WFM layer. The barrier metal layer can also prevent carrier/ion diffusion between the capping layer and the WFM layer. The barrier metal layer can be formed by CVD, PVD, ALD, PECVD, MOCVD, sputtering, other suitable depositions methods, or any combination thereof. The barrier metal layer can have a thickness of about 1 nm to about 3 nm. In some embodiments, the barrier metal layer has a thickness of about 1.5 nm. In the present disclosure, 118, 118', and 118" represents the barrier metal layer in intermediate gate structures 108'-1, 108'-2, and 108'-3, respectively.

A WFM layer can be further formed over the barrier metal layer in gate-forming trench 117'. Exemplary p-type work function metals that can be included in the metal gate structure include TiN, TaN, ruthenium (Ru), molybdenum (Mo), aluminum (Al), tungsten nitride (WN), zirconium silicide ($ZrSi_2$), molybdenum silicide ($MoSi_2$), tantalum silicide ($TaSi_2$), nickel silicide ($NiSi_2$), other suitable p-type work function materials, or combinations thereof. Exemplary n-type work function metals that can be included in the metal gate structure include Ti, silver (Ag), tantalum aluminide (TaAl), tantalum aluminide carbide (TaAlC), tantalum aluminide nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer, and thus, the material of the first work function layer is chosen to tune its work function so that a desired threshold voltage $V_t$ is achieved in the device that is to be formed in the respective region. In some embodiments, the WFM layer can include work-function metals such as TiN, TiAlN, TiAlC, other suitable work-function metals, or any combination thereof. The WFM layer can change the threshold voltage of gate structure 108' to a desired value. The WFM layer can be formed by CVD, PVD, ALD, PECVD, MOCVD, sputtering, other suitable depositions methods, or any combination thereof. In some embodiments, the WFM layer has a thickness of about 1 nm to about 3 nm. In the present disclosure, 119, 119', and 119" represents the WFM layer in intermediate gate structures 108'-1, 108'-2, and 108'-3, respectively.

A filler gate metal layer (e.g., gate metal layer) can further be formed over the WFM layer in gate-forming trench 117'. The filler gate metal layer fills up the rest of space in gate-forming trench 117'. The filler gate metal layer can include suitable conductive metals such as copper, aluminum, and/or tungsten. In some embodiments, the filler gate metal layer includes tungsten. The filler gate metal layer can be formed by CVD, PVD, ALD, PECVD, MOCVD, sputtering, other suitable depositions methods, or any combination thereof. In some embodiments, the filler gate metal layer has a thickness of about 1 nm to about 3 nm. In the present disclosure, 121 and 121' represent the filler gate metal layer in intermediate gate structures 108'-2 and 108'-3, respectively. In some embodiments, intermediate gate structure 108'-1 includes little or no gate metal, as shown in FIG. 3A. The reason for the lack of gate metal in intermediate gate structure 108'-1 can include, e.g., small gate length and lack of space for deposition of gate metal after WFM layer 119 is formed. As shown in FIG. 3A, WFM layer 119 fills up the rest of space in gate-forming trench 117' after the deposition of barrier metal layer 118. Further, because the gate length of intermediate gate structure 108'-2 is smaller than the gate length of intermediate structure 108'-3, less gate metal is deposited in structure 108'-2 than in structure 108'-3.

In some embodiments, after the above-described layers are formed, a planarization process, e.g., chemical mechanical planarization (CMP), is used to remove the extra thickness of these layers over spacer layer 111. The top surface of gate-forming trench 117' can be planarized. That is, the top surfaces of spacer layer 111, the high-k dielectric layer, the capping layer, the barrier metal layer, the WFM layer, and the filler gate metal layer can be substantially co-planar with one another. For illustrative purposes, the semiconductor structure formed after the planarization process is referred to as an intermediate gate structure 108'. In various embodiments, other planarization/etching process can also be used to form intermediate gate structures 108'-1, 108'-2, and 108'-3.

As shown in FIGS. 3A-C, high-k dielectric layer 115 (115', 115"), capping layer 116 (116', 116"), barrier metal layer 118 (118', 118") each forms a "U" shape (e.g., along 131 cut line or in x-y plane) in gate-forming trench 117' of each of intermediate gate structure 108'-1, 108'-2, and 108'-3. Due to the gate length differences, WFM layers 119' and 119" in structures 108'-2 and 108'-3 can each form a "U" shape in respective gate-forming trench 117', and WFM layer 119 in structure 108'-1 can form a vertical strip (e.g., along y-axis) in gate-forming trench 117'. Accordingly, for intermediate gate structure 108'-1, the topmost surface of WFM layer 119 can be substantially co-planar with the top surface of structure 108'-1; for intermediate gate structure 108'-2 and 108'-3, the two topmost surfaces of each WFM layers 119' and 119" can be substantially co-planar with the top surfaces of the respective intermediate gate structure.

As shown in FIGS. 3A-3C, filler gate metal layer 121 deposited in an intermediate gate structure with smaller gate length (e.g., structure 108'-2) is less than filler gate metal layer 121' deposited in an intermediate gate structure with larger gate length (e.g., structure 108'-3). Especially, for some intermediate gate structures with small gate lengths (e.g., structure 108'-1), no gate metal can be deposited in the gate-forming trench 117'. As a result, as technology node advances, it becomes more difficult to deposit sufficient gate metal in a metal gate structure. The gate resistance of a metal gate structure can increase accordingly as the amount of gate metal decreases. That is, the gate resistance can increase from structure 108'-1 to structure 108'-3. FIGS. 4-5 below are used to illustrate embodiments of the disclosed method to improve the gate resistance of different intermediate gate structures.

FIGS. 4A-4C illustrate structures 400 including exemplary intermediate gate structures 108'-1, 108'-2, and 108'-3 of different gate lengths, according to some embodiments, each taken along cut line 131 shown in FIG. 1A. In some embodiments, the top portion(s) of WFM layer in each of intermediate gate structures 108'-1, 108'-2, and 108'-3 is etched back to a desired depth, forming an etch-back trench from the exposed topmost surfaces of the WFM layers. As shown in FIGS. 4A-4C, in structure 108'-1, etch-back trench 117A is formed in WFM layer 119, having a vertical depth (or recess depth) of about h1; in structure 108'-2, etch-back trenches 117B1 and 117B2 are formed in WFM layer 119', each having a vertical depth (e.g., along y-axis) of about h2; in structure 108'-3, etch-back trenches 117C1 and 117C2 are formed in WFM layer 119", each having a vertical depth of about h3. In some embodiments, the vertical depths of the etch-back trenches in each WFM layer can vary between about 40 nm to and about 50 nm, and h1, h2, and h3 can be the same or different. For illustrative purposes, it is assumed that the etch-back trenches (e.g., h1, h2, and h3) in the same gate-forming trench have roughly the same depth. In some embodiments, h1, h2, and h3 are smaller than the vertical length of the respective WFM layer and are about 40 nm.

In some embodiments, top portion(s) of the WFM layer in intermediate gate structure 108' is removed and etch-back trench(es) are formed. Inner surfaces (e.g., etched portions) can be exposed. For example, for etch-back trench 117A of structure 108'-1, the topmost surface of the etched WFM layer 119 and the sidewall surfaces of barrier metal layer 118 can be exposed; for etch-back trenches 117B1 and 117B2 of structure 108'-2, the topmost surfaces of the etched WFM layer 119', a portion of the sidewall surfaces of filler gate metal layer 121, and a portion of the sidewall surfaces of barrier metal layer 118' can be exposed; for etch-back trenches 117C1 and 117C2 of structure 108'-3, the topmost surfaces of the etched WFM layer 119", a portion of the sidewall surfaces of filler gate metal layer 121', and a portion of the sidewall surfaces of barrier metal layer 118" can be exposed. The exposed surfaces can form contact with the subsequently-deposited filler gate metal (e.g., gate metal deposited in subsequent processes to fill in the etch-back trenches).

In some embodiments, the etch back process can be performed using a suitable etching process. In some embodiments, a wet etch is performed to selectively etch the top portion(s) of the respective WFM layer. In some embodiments, the etchant (e.g., etching solution) selectively etches the WFM layer over other layers/materials in gate-forming trench 117'. For example, the etchant can have an etching selectivity (e.g., ratio of etch rates) of at least about 2 over gate metal, and/or an etching selectivity of at least about 2 over high-k dielectric material. In some embodiments, the etching selectivity over gate metal is at least about 3. The etching selectivity over other layers/materials can be desirably high such that after the selective etch, top portion(s) of the WFM layer are removed and other layers in gate-forming trench 117' can remain at least substantially the same thicknesses/heights/shapes.

The etchant can be dispensed over the wafer or semiconductor structures 100 that need to be processed at a suitable condition. The etchant can include phosphoric acid ($H_3PO_4$), mixed with other etchants and/or additives. In some embodiments, the etchant includes a mixture of hydrogen peroxide ($H_2O_2$), $H_3PO_4$, and hot deionized water (HDIW). In some embodiments, the filler gate metal layer includes tungsten and the WFM layer includes TiN, and the weight ratio of $H_3PO_4:H_2O_2:HDIW$ is about 10:1:1.5, and the etching selectivity is about 5 (e.g., the etching rate of WFM layer is about 5 times the etching rate of the filler gate metal layer). In some embodiments, the weight ratio of $H_2O_2$, $H_3PO_4$, and HDIW can vary to tune the etching selectivity and/or etching rates over the same or different materials. For example, the weight ratio of $H_3PO_4:H_2O_2:HDIW$ can change when the filler gate metal layer and/or the WFM layer include other materials. In some embodiments, other acidic medium or solution can be mixed with the mixture to obtain different etching selectivity, etching rate, and/or pH control. For example, HCl can be added into the mixture to adjust the pH value of the etchant. The etching condition/parameters (e.g., etching time and etchant temperature) can be controlled to obtain the desired vertical depths of the etch-back trenches. For example, to obtain a vertical depth of about 40 nm at the etching selectivity of about 5, semiconductor structures 100 can be etched for about 360 seconds at an etching temperature from room temperature to about 80 degrees Celsius. In some embodiments, increasing the etchant temperature increases the etching rate and thus decreases the etching time.

In some embodiments, after the etching process, the semiconductor structures 100 or wafer in process are rinsed using a wet solution. In some embodiments, the rinsing solution is a mixture of pure deionized water (DIW), deionized water including carbon dioxide ($DI-CO_2$), diluted ammonium hydroxide ($NH_4OH$), any other suitable rinsing solution, or any combination thereof. The rinsed semiconductor structures 100 or wafer can be dried using any suitable methods. In some embodiments, the drying process includes nitrogen ($N_2$) spin drying and/or isopropyl alcohol (IPA) drying. The drying processes are performed at a drying temperature from room temperature to about 80 degrees Celsius.

The etchant can be used to form a self-assembled monolayer (SAM) when reacting with the WFM layer and/or some other layers (e.g., the filler gate metal layer, and/or the barrier metal layer) of structure 108'. In some embodiments, the etchant helps form a SAM when reacting with the filler gate metal layer, the WFM layer, and the barrier metal layer, and the SAM covers the exposed surfaces of these layers after the etching process. Referring to FIGS. 4A-4C, the bold dashed lines (labeled 120, 120', and 120") represent the SAM formed after the selective etch. After the selective etch, the SAM can cover the exposed topmost surface(s) of the WFM layer, the exposed top and sidewall surfaces of the filler gate metal layer, and the exposed topmost surfaces of the barrier metal layer. For example, for structure 108'-1, the SAM can cover the exposed topmost surface of the etched WFM layer 119 and the exposed top and sidewall surfaces of barrier metal layer 118; for structure 108'-2, the SAM can cover the exposed topmost surfaces of the etched WFM layer 119', the exposed top and sidewall surfaces of filler gate metal layer 121, and the exposed top and sidewall surfaces of barrier metal layer 118'; for structure 108'-3, the SAM can cover the exposed topmost surfaces of the etched WFM layer 119", the exposed top and sidewall surfaces of filler gate metal layer 121', and the exposed top and sidewall surfaces of barrier metal layer 118". The SAM can function as a "glue layer" or an adhesive layer to subsequently join/attach the filler gate metal in the etch-back trenches (e.g., 117A, 117B1, 117B2, 117C1, and 117C2) and improve the contact/adhesion between the filler gate metal and the materials in the etch-back trenches.

Specifically, the SAM can be formed between phosphate ($PO_4^{3-}$) and materials (e.g., materials of WFM layer, filler gate metal layer, and/or barrier metal layer) in intermediate gate structures 108'-1, 108'-2, and 108'3. For example, phosphate can form SAM with metal oxides in these layers. In some embodiments, the metal layer includes tungsten, the WFM layer includes TiN, and the barrier metal layer includes TaN. Phosphate can then react with titanium oxide in the WFM layer to form a Ti-phosphate SAM over the exposed surfaces of WFM layer, react with tantalum oxide in the barrier metal layer to form a Ta-phosphate SAM over the exposed surfaces of the barrier metal layer, and react with tungsten oxide in the filler gate metal layer to form a W-phosphate SAM over exposed surfaces of the filler gate metal layer. In the present disclosure, terms "metal-phosphate SAM" are merely for the ease of description to distinguish different chemical compounds and do not indicate the chemical composition or chemical formula of the compounds.

The SAM can cover the materials reacting with phosphate. In some embodiments, the composition of the etchant is chosen to adapt with the materials to be etched and/or exposed such that a SAM can be formed to fully cover the inside surfaces of the etch-back trenches. The SAM can provide improved adhesion between the subsequently-deposited filler gate metal and the etch-back trenches so that the filler gate metal can fill the etch-back trenches with little or no voids. Accordingly, the amount of gate metal in the subsequently-formed metal gate structure can be increased, and the gate resistance can be decreased. In some embodiments, the SAM is formed over the WFM layer, improving adhesion between the filler gate metal and the WFM layer. In some embodiments, the SAM is formed over the filler gate metal layer, improving the adhesion between the filler metal and the gate metal can be improved such that no voids are formed therebetween. In some embodiments, the resistance of the SAM can be sufficiently low or negligible such that the presence of the SAM has little or no effect on the electrical conductivity of the filler gate metal layer and the filler gate metal. In various embodiments, other suitable materials can also be used to form the WFM layer, the filler gate metal layer, and/or the metal barrier layer. The composition of the etchant can vary to ensure the SAM, with adhesive functions to join the filler gate metal to the WFM layer, can be formed at least over the WFM layer. The specific choices of etchant composition should not be limited by the embodiments of the present disclosure.

In some embodiments, the etch back of the WFM layer can also be obtained through other methods. For example, using a patterning process, the topmost surface(s) of the WFM layer in an intermediate gate structure 108' can be exposed and etched, and the topmost surface(s) of other layers can be covered using a mask. Accordingly, the top portion(s) of the WFM layer can be removed through a suitable etch (e.g., a timed wet/dry etching process). The mask can be removed after the etch back. An optional adhesive layer (e.g., liner layer or SAM) can be formed over the inner sidewalls of the etch-back trenches (e.g., 117A, 117B1, 117B2, 117C1, and 117C2) using any suitable method. For example, a suitable acidic solution (e.g., phosphate-based solution) can be used to rinse the etch-back trenches so that an adhesive layer can be formed in the etch-back trenches. The adhesive layer can be in any suitable form, such as a monolayer or a thin film. The resistance of the adhesive layer can be sufficiently low such that the presence of the adhesive layer has little or no effect on the electrical conductivity of the filler gate metal layer and the filler gate metal.

Figures 5A, 5B, 5C:
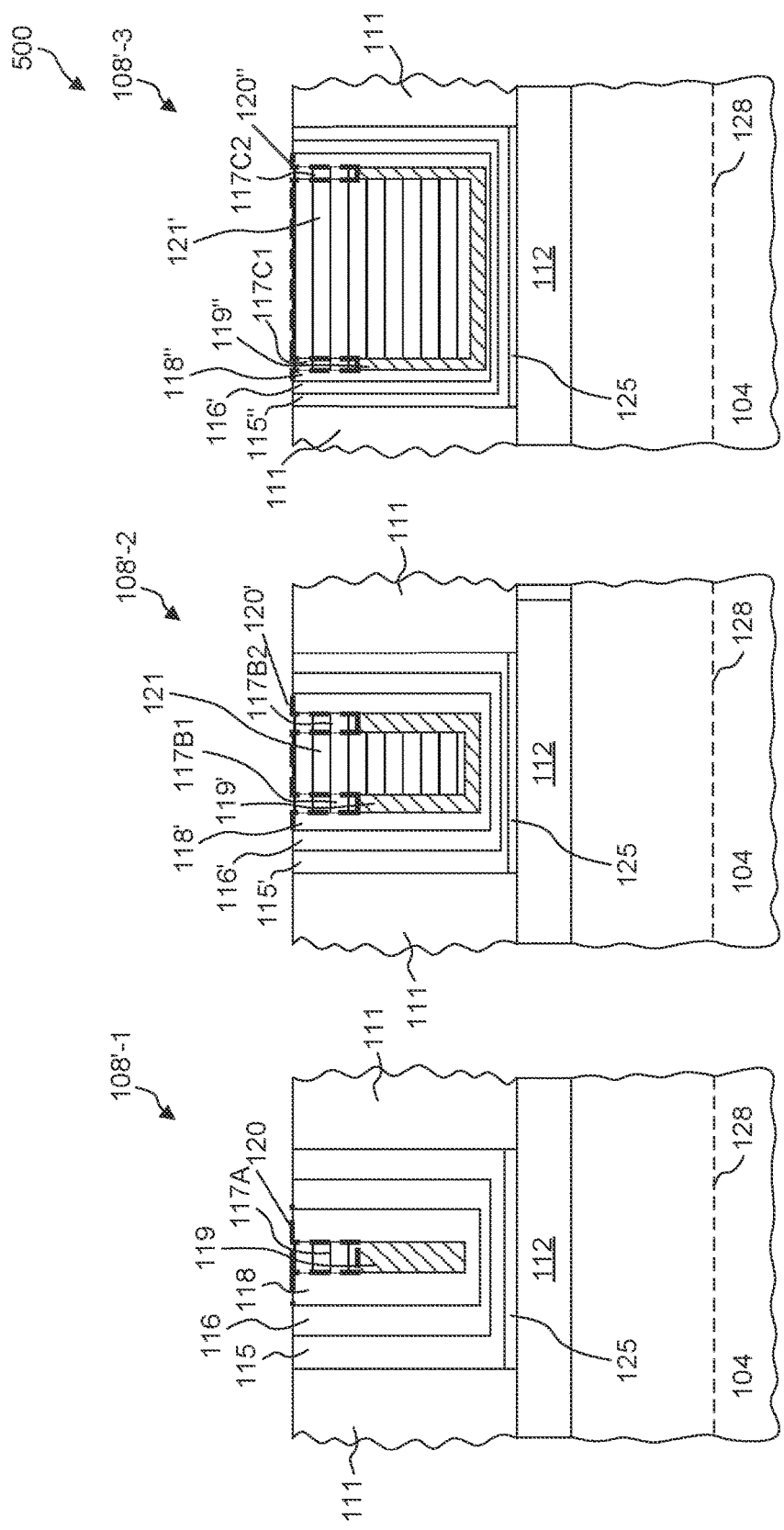

FIGS. 5A-5C illustrate structures 500 including exemplary intermediate gate structures 108'-1, 108'-2, and 108'-3 of different gate lengths, according to some embodiments, each taken along cut line 131 shown in FIG. 1A. As shown in FIGS. 5A-5C, filler gate metal (shown as having the same pattern as the filler gate metal layers) can be deposited into the etch-back trench(es) to form contact with the filler gate metal layer(s). The SAM formed in each of structures 108'-1, 108'-2, and 108'-3 can improve the adhesion/joining between the filler gate metal and the filler gate metal layer, between the filler gate metal and the WFM layer, and/or between the filler gate metal and the barrier metal layer. In some embodiments, the filler gate metal has a higher doping level than the filler gate metal layer. In some embodiments, the filler gate metal is formed through a suitable deposition method (e.g., CVD, ALD, etc.) and is doped through in-situ doping so that a desired doping level and dopant type(s) can be formed in the filler gate metal to further reduce the resistance of the subsequently-formed metal gate structure.

In some embodiments, the filler gate metal is deposited through a selective deposition method and is doped through in-situ doping during the selective deposition method. In some embodiments, the filler gate metal layer includes tungsten and the filler gate metal includes tungsten. The selective deposition method to form tungsten can include ALD. In some embodiments, the ALD process can be performed using precursor gases of tungsten pentachloride gas ($WCl_5$) and hydrogen gas ($H_2$). Solid tungsten can be selectively formed in the etch-back trenches. In some embodiments, the flow rate of $WCl_5$ is in the range of about 50 to about 100 standard cubic centimeters per minute (sccm), and the flow rate of hydrogen is in the range of about 1000 to about 2000 sccm. The $WCl_5$ can be pumped in to the reaction chamber at about 450 to about 550 degrees Celsius, carried by argon gas, forming a chamber pressure of about 40 Torr. The hydrogen can be pumped into the reaction chamber and form a chamber pressure of about 60 Torr. Accordingly, tungsten can be deposited and can fill in the etch-back trenches. In some embodiments, using the selective deposition method, the formation of tungsten does not require additional mask to confine the tungsten to be formed in the etch-back trenches. In some embodiments, after tungsten formation, a CMP process is performed to planarize the top surfaces of intermediate gate structures 108'-1, 108'-2, and 108'-3.

In some embodiments, other (e.g., selective or non-selective) deposition methods can also be used to fill in the etch-back trenches with filler gate metal. If a non-selective deposition method is used, an etch back may be performed to remove excessive gate metal formed outside of the etch-back trenches. For example, a patterning process can be performed to expose and remove the excessive gate metal outside of the etch-back trenches. A CMP process can then be performed to planarize the top surfaces of the intermediate gate structures 108'-1, 108'-2, and 108'-3.

In some embodiments, filler gate metal including a different gate metal (e.g., a gate metal different from the original gate metal material of the filler gate metal layer) can also be deposited. The filler gate metal can have comparable or lower electrical resistance than the filler gate metal layer. In some embodiments, the SAM covering the etch-back trenches can improve the adhesion between the filler gate metal (e.g., which includes a metal/conductive material different from the original gate metal material of the filler gate metal layer) and at least the WFM layer.

In some embodiments, suitable dopants can be formed into the filler gate metal to further reduce the gate resistance. For example, boron (B) can be doped into the filler gate metal to increase the doping level and thus reduce gate resistance. Boron can be deposited into a filler gate metal that includes a material the same as or different from the original gate metal material of the filler gate metal layer. In some embodiments, the SAM covering the etch-back trenches can improve the adhesion between the doped filler gate metal and at least the WFM layer. In some embodiments, the SAM joins the doped filler gate metal to the filler gate metal layer with little or no voids therein.

After the filler gate metal is deposited into the etch-back trenches (e.g., 117A, 117B1, 117B2, 117C1, and 117C2), metal gate structures can be formed. The gate structures 108'-1, 108'-2, and 108'-3 shown in FIGS. 5A-5C can represent the cross-sectional views of the formed metal gate structures with filler gate metal. Compared to the metal gate structures without the filler gate metal (e.g., intermediate gate structures 108'-1, 108'-2, and 108'-3 shown in FIGS.

3A-3C), metal gate structures with filler gate metal can include more gate metal and can have lower gate resistance.

In some embodiments, after metal gate structures are formed, the metal gate structures are divided/separated/cut along x-axis (referring to the x-axis in FIG. 1A) or the direction the metal gate structures propagate to form short channel metal gate structures. For example, one metal gate structure can be over one fin 104. In some embodiments, the channel length after the division/cut is in the range of about 10 to about 10 nm. Optionally, an insulating material (e.g., SiN and/or $SiO_x$) can be deposited over the separated metal gate structures to electrically insulate one metal gate structure from another. In some embodiments, a CMP is performed to planarize the top surface of the insulating material. In some embodiments, the aforementioned process is referred to as a "cut last approach."

In the present disclosure, replacing a portion of the WFM layer with a conductive material is illustrated as a method to decrease the gate resistance of the metal gate structure. In some embodiments, other parts/layers of the metal gate structure can also be replaced with a conductive material (e.g., having a desired resistance and/or doping level) to further decrease the gate resistance. For example, top portions of barrier metal layer can be removed (or selectively removed) together with the top portions of the WFM layer to further increase the amount of gate metal in the metal gate structure. One or more etch back processes can be performed. Accordingly, the etchant to remove these portions can be adjusted to form a SAM over the etched surfaces and improve adhesion between the subsequently-deposited conductive material and other layers exposed by the etched surfaces. Further, a suitable conductive material can be formed (or selectively formed) in the etch-back trenches to fill up the metal gate structure. The specific methods and structures should be referred to the embodiments of the present disclosure and are not repeated herein.

By using the disclosed method and structure, metal gate structures with lower gate resistance is formed in comparison with other approaches. A selective etch can be performed to remove top portions of the WFM layer and form a SAM over the inner surfaces of the etched portions to improve the adhesion between the subsequently-deposited filler gate metal and the WFM layer. A selective deposition can be performed to fill the etched portions with filler gate metal, which can have comparable or lower gate resistance compared to the original gate metal material. For a metal gate structure with little or no filler gate metal layer over the WFM layer before the gate metal filling process, gate metal can be deposited into the gate metal structure after the filling process, and the gate resistance can be reduced. For a metal gate structure with insufficient amount of gate metal in the filler gate metal layer before the gate metal filling process, more gate metal (e.g., or conductive material with comparable or lower resistance) can be included in the metal gate structure to further reduce the gate resistance. In some embodiments, the selective etch and the selective deposition require no additional mask for processing and thus do not add additional fabrication processes to the formation of semiconductor structures 100. In some embodiments, the selective etch has no or little impact on the gate dimensions (e.g., gate height). In some embodiments, the gate height of the metal gate structure undergoes a reduction of up to about 10% after the fabrication processes, e.g., the etch back processes.

Figure 6:
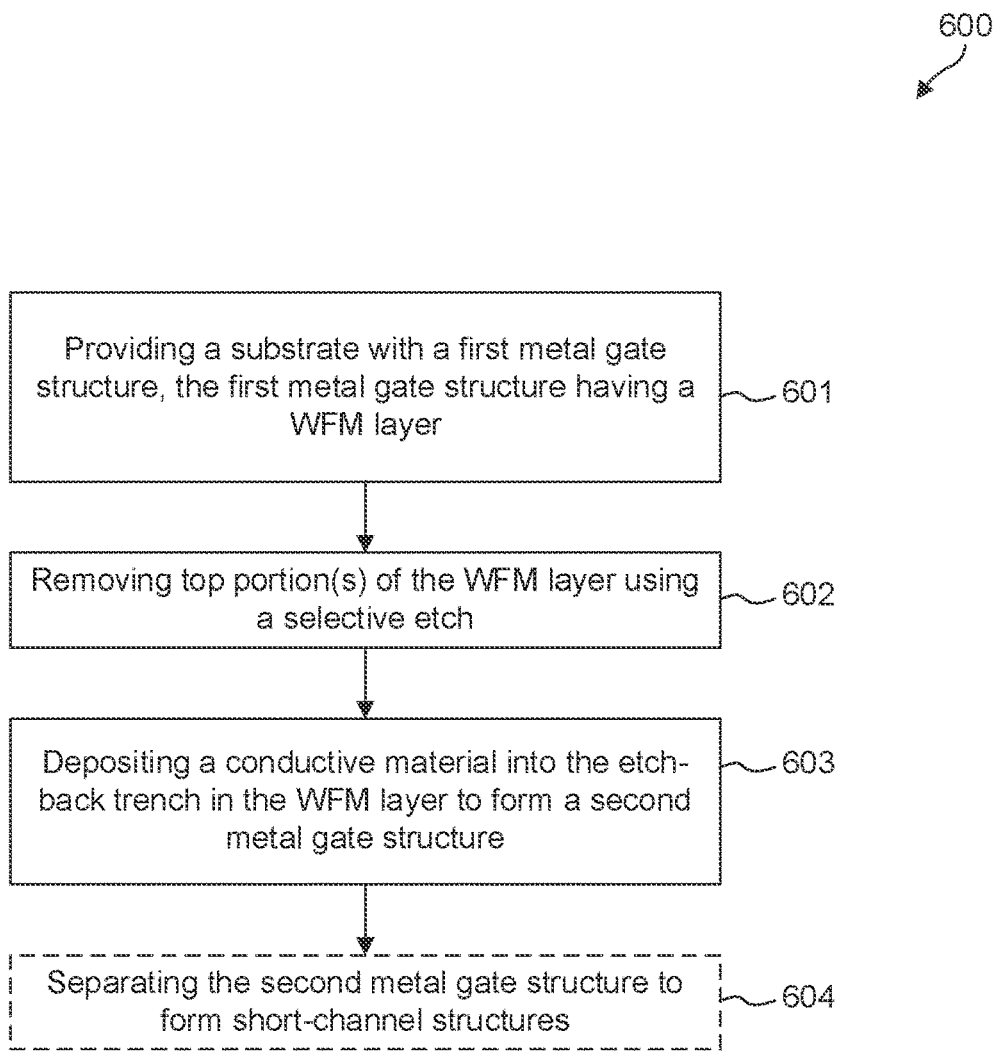
FIG. 6 is an illustration of a fabrication process for forming gate metal in etched back gate electrodes, according to some embodiments.

FIG. 6 is a flow diagram of an illustrative method 600 of forming metal gate structure with filler gate metal. Other fabrication processes can also be performed between the various operations of method 600 and are omitted here for clarity. The fabrication processes illustrated in FIG. 6 can also be performed in a different order. Any variation of the illustrated fabrication operations are within the scope of the present disclosure. For ease of description, term "first metal gate structure" is used to refer to a metal gate structure before the disclosed method is performed, and "second metal gate structure" is used to refer to a metal gate structure formed by using the disclosed method.

In operation 601, a substrate is provided. The substrate can include a first metal gate structure, including a WFM layer. The first metal gate structure can be formed from a gate replacement process and can also include other layers (e.g., high-k dielectric layer, capping layer, barrier metal layer, etc.) surrounding the WFM layer. In some embodiments, the first metal gate structure has a small gate length and includes little or no gate metal over the WFM layer. In some embodiments, the first metal gate structure has insufficient amount of gate metal over the WFM layer. The substrate can include any suitable, e.g., semiconductor materials. The WFM layer can include a suitable material with a desired work function, such as TiN. The gate metal can include a suitable conductive material, such as tungsten. FIGS. 3A-3C and its associated description provide further details on the first metal gate structure.

In operation 602, top portion(s) of the WFM layer are removed using a selective etch. A selective etch can be performed by dispensing an etchant with desired etching selectivity over the wafer/substrate. In some embodiments, the etchant has a desirably higher etching selectivity of WFM layer over other materials (e.g., the gate metal) of the first metal gate structure. In some embodiments, the selective etch can be timed so that a desirable amount (e.g., depth) of the top portion(s) of the WFM layer is removed. After the etching process, etch-back trenches can be formed in the WFM layer and the topmost surfaces of the WFM layer can be exposed. In some embodiment, the filler gate metal layer includes tungsten and the WFM layer includes TiN, and a mixture of phosphoric acid, $H_2O_2$, and HDIW is used for the selective etch. In some embodiments, the etchant has an etching selectivity of 5 for TiN over W. In some embodiments, the exposed inner surfaces of the etch-back trenches also include other layers surrounding the WFM layer, e.g., the filler gate metal layer and/or the barrier metal layer. The etchant can react with the exposed materials in the etch-back trenches and form a SAM over the exposed surfaces of the etch-back trenches. The SAM can improve adhesion between the subsequently-deposited filler gate metal and the exposed inner surfaces of the etch-back trenches. In some embodiments, the SAM improves the adhesion between the subsequently-formed filler gate metal and the WFM layer and reduces/eliminates voids between the filler gate metal and the filler gate metal layer. Details of the composition of the etchant and the SAM are described above in FIGS. 4A-4C and its associated description.

In operation 603, a conductive material is deposited into the etch-back trench in the WFM layer to form a second metal gate structure. The conductive material can be referred to as a "filler gate metal." A selective deposition method can be used to deposit a suitable conductive material, which is the same as or different from the filler gate metal layer. In-situ doping can be used to increase the doping level of the conductive material so that the gate resistance of the second metal gate structure can be further decreased. In some embodiments, ALD is performed to selectively deposit the conductive material into the etch-back trenches. In some embodiments, the filler gate metal layer of the first metal gate structure includes tungsten, the filler gate metal includes tungsten, and boron is doped into the filler gate metal through in-situ doping. Meanwhile, the SAM over the inner surfaces of the etch-back trenches can improve the adhesion between the filler gate metal and the WFM layer, and between the filler gate metal and the filler gate metal layer. In some embodiments, the ALD process can be performed using precursor gases of tungsten pentachloride gas ($WCl_5$) and hydrogen gas ($H_2$). Solid tungsten can be selectively formed in the etch-back trenches. In some embodiments, the flow rate of $WCl_5$ is in the range of about 50 to about 100 standard cubic centimeters per minute (sccm), the flow rate of hydrogen is in the range of about 1000 to about 2000 sccm. The $WCl_5$ can be pumped in to the reaction chamber at about 450 to about 550 degrees Celsius, carried by argon gas, forming a chamber pressure of about 40 Torr. The hydrogen can be pumped into the reaction chamber and forming a chamber pressure of about 60 Torr. Optionally, a CMP process can be performed to planarize the top surface of the second metal gate structure. Details of the filler gate metal are described above in FIGS. 5A-5C and its associated description.

Optionally, method 600 further includes operation 604. In operation 604, the second metal gate structure can be cut/divided along the direction fins 104 propagate to form short-channel structures. An insulating material (e.g., SiN) can be used to fill in the space between adjacent short-channel structures and insulate the short-channel structures from one another. In some embodiments, a CMP is performed to planarize the short-channel structures.

The present disclosure describes a selective etch back process to remove a portion of WFM that surrounds the gate metal in a metal gate. The space formed by the removal of the WFM is then filled with a conductive material with comparable or lower resistance to increase the gate metal volume in the metal gate. The selective etch back process forms a self-assembled monolayer (SAM) over the etched portion. The SAM can improve the adhesion between the etched portion and the newly deposited filler gate metal. The newly deposited filler gate metal (e.g., the conductive material) can be deposited using a selective deposition method and can include desired/different dopant concentration/types to further improve (e.g., reduce) the gate resistance. No additional mask or additional fabrication process is needed for the selective etch back and the selective deposition method. Gate height is thus not substantially affected (e.g., reduced) and more gate metal can be deposited into the metal gate. By using the disclosed method, the metal gate can have an increased amount of gate metal than originally fabricated, reducing the gate resistance and improving the electrical properties of the semiconductor device. Further, the newly deposited filler gate metal can adhere to the etched portion of the metal gate with little or no void formed therein. The formed gate metal can be more uniform. Gate resistance can further be reduced. The disclosed method and structure thus improve device performance.

In some embodiments, a finFET device includes: a substrate; a fin over the substrate; and a gate structure over the fin. The gate structure includes: a WFM layer over an inner sidewall of the gate structure, a topmost surface of the WFM layer being lower than a top surface of the gate structure; a filler gate metal layer over the topmost surface of the WFM layer, a top surface of the filler gate metal layer substantially co-planar with the top surface of the gate structure; and a SAM between the filler gate metal layer and the WFM layer.

In some embodiments, a method for forming a semiconductor device includes: providing a substrate, the substrate including a gate structure with a WFM layer; removing a top portion of the WFM layer; forming a SAM over a topmost surface of the WFM layer exposed by the removed top portion of the WFM layer; and depositing a filler gate metal layer into the removed top portion of the WFM layer, the SAM being between the filler gate metal layer and the WFM layer.

In some embodiments, a method for forming a semiconductor device includes: providing a substrate, the substrate including a gate structure; selectively removing a top portion of the gate structure; forming an adhesive layer over a top surface of the gate structure exposed by the removed top portion of the gate structure; and selectively depositing a conductive layer into the removed top portion of the gate structure over the adhesive layer, the adhesive layer joining the conductive layer and the top surface of the gate structure exposed by the removed top portion of the gate structure.

It can be to be appreciated that the Detailed Description section, and not the Abstract of the Disclosure, can be intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A structure, comprising:
a channel region on a substrate;
a barrier metal layer on the channel region;
a work-function metal (WFM) layer over an inner side surface of the barrier metal layer;
a self-assembled monolayer (SAM) on an upper surface of the WFM layer; and
a filler gate metal layer on and in direct contact with the SAM.

2. The structure of claim 1, wherein the SAM is in contact with the inner side surface of the barrier metal layer.

3. The structure of claim 1, wherein the SAM comprises an adhesion layer between the WFM layer and the filler gate metal layer.

4. The structure of claim 1, wherein the SAM is in contact with a top surface of the barrier metal layer.

5. The structure of claim 1, further comprising a gate metal layer on another upper surface of the WFM layer.

6. The structure of claim 5, wherein the SAM is in contact with a top surface of the gate metal layer.

7. The structure of claim 1, wherein the filler gate metal layer comprises boron.

8. The structure of claim 1, further comprising a gate dielectric layer on the channel region and under the barrier metal layer.

9. A structure, comprising:
a work-function metal (WFM) layer on a channel region;
a first gate metal layer on a side surface of the WFM layer;
a self-assembled monolayer (SAM) on the WFM layer and the first gate metal layer; and a second gate metal layer on the WFM layer and separated from the first gate metal layer by the SAM.

10. The structure of claim 9, wherein a side surface of the second gate metal layer is above and substantially coplanar with the side surface of the WFM layer.

11. The structure of claim 9, wherein a top surface of the first gate metal layer is substantially coplanar with a top surface of the second gate metal layer.

12. The structure of claim 9, further comprising a third gate metal layer on the SAM and separated from the second gate metal layer by the first gate metal layer, wherein a bottom surface of the third gate metal layer is coplanar with a bottom surface of the second gate metal layer.

13. The structure of claim 12, wherein the third gate metal layer is in contact with a side surface of the SAM.

14. The structure of claim 9, wherein the SAM comprises phosphate.

15. The structure of claim 9, further comprising a dielectric layer on the channel region and under the WFM layer.

16. A structure, comprising:
   a dielectric layer on a substrate;
   a work-function metal (WFM) layer on the dielectric layer;
   a gate metal layer on the WFM layer;
   a self-assembled monolayer (SAM) on first and second top surfaces of the WFM layer, wherein the first and second top surfaces are separated by the gate metal layer; and
   a filler gate metal layer on the SAM.

17. The structure of claim 16, wherein a first boron-doping level in the filler gate metal layer is greater than a second boron-doping level in the gate metal layer.

18. The structure of claim 16, wherein:
   a first portion of the SAM on the first top surface of the WFM layer and a second portion of the SAM on the second top surface of the WFM layer are substantially coplanar; and
   the first and second portions of the SAM are separated by the gate metal layer.

19. The structure of claim 18, wherein the filler gate metal layer comprises:
   a first portion of the filler gate metal layer in contact with the first portion of the SAM; and
   a second portion of the filler gate metal layer in contact with the second portion of the SAM.

20. The structure of claim 16, wherein a top surface of the gate metal layer is above a bottom surface of the filler gate metal layer.

* * * * *